(12) United States Patent
Miao et al.

(10) Patent No.: US 12,446,395 B2
(45) Date of Patent: Oct. 14, 2025

(54) DISPLAY PANEL, DISPLAY APPARATUS, AND MANUFACTURING METHOD FOR DISPLAY PANEL

(71) Applicants: Hefei BOE Joint Technology Co., Ltd., Anhui (CN); BOE Technology Group Co., Ltd., Beijing (CN)

(72) Inventors: Kangjian Miao, Beijing (CN); Minghung Hsu, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 493 days.

(21) Appl. No.: 17/788,558

(22) PCT Filed: Sep. 1, 2021

(86) PCT No.: PCT/CN2021/115919
§ 371 (c)(1),
(2) Date: Jun. 23, 2022

(87) PCT Pub. No.: WO2022/088948
PCT Pub. Date: May 5, 2022

(65) Prior Publication Data
US 2023/0032598 A1    Feb. 2, 2023

(30) Foreign Application Priority Data
Oct. 27, 2020  (CN) .......................... 202011165747.4

(51) Int. Cl.
*H10K 50/824*  (2023.01)
*H10K 50/805*  (2023.01)
(Continued)

(52) U.S. Cl.
CPC ......... *H10K 50/824* (2023.02); *H10K 50/805* (2023.02); *H10K 50/828* (2023.02);
(Continued)

(58) Field of Classification Search
None
See application file for complete search history.

(56) References Cited

U.S. PATENT DOCUMENTS

2010/0309101 A1 * 12/2010 Kanegae .............. H10K 59/122
438/34
2012/0104422 A1 * 5/2012 Lee ...................... H10K 59/121
438/34
(Continued)

FOREIGN PATENT DOCUMENTS

CN  102856505 A  1/2013
CN  103996690 A  8/2014
(Continued)

OTHER PUBLICATIONS

CN202011165747.4 first office action.
CN202011165747.4 Decision of Rejection.

*Primary Examiner* — Ajay Ojha
*Assistant Examiner* — Pinaki Das
(74) *Attorney, Agent, or Firm* — IPro, PLLC

(57) ABSTRACT

A display panel includes: a base substrate, a pixel defining layer, light-emitting portions, an electrode layer, a metal repelling portion, and an auxiliary electrode layer. The pixel defining layer includes opening regions and dams. The light-emitting portions are in the opening regions. The electrode layer is on the side of the light-emitting portions facing away from the base substrate. The metal repelling portion is on the side of the electrode layer facing away from the base substrate and in the opening regions. The auxiliary electrode layer is on the side of the pixel defining layer facing away from the base substrate, and includes auxiliary (Continued)

electrode portions located in the region where the dams are located. The auxiliary electrode portions are in contact with third portions of the electrode layer, and the material of the metal repelling portion and the material of the auxiliary electrode layer repel each other.

14 Claims, 3 Drawing Sheets

(51) Int. Cl.
  *H10K 50/828* (2023.01)
  *H10K 50/856* (2023.01)
  *H10K 59/12* (2023.01)
  *H10K 59/122* (2023.01)
  *H10K 59/80* (2023.01)
  *H10K 71/00* (2023.01)

(52) U.S. Cl.
  CPC ......... *H10K 50/856* (2023.02); *H10K 59/122* (2023.02); *H10K 59/805* (2023.02); *H10K 71/00* (2023.02); *H10K 59/1201* (2023.02)

(56) References Cited

U.S. PATENT DOCUMENTS

| | | | |
|---|---|---|---|
| 2012/0313099 A1* | 12/2012 | Chung | H10K 59/131 438/34 |
| 2014/0145156 A1* | 5/2014 | Choi | H10K 71/00 438/34 |
| 2016/0308162 A1* | 10/2016 | Yoo | H10K 50/858 |
| 2017/0338438 A1* | 11/2017 | Kwon | H10K 59/122 |
| 2019/0363279 A1 | 11/2019 | Yamaguchi et al. | |
| 2021/0359249 A1* | 11/2021 | Zhang | H10K 50/824 |

FOREIGN PATENT DOCUMENTS

| | | |
|---|---|---|
| CN | 109599430 A | 4/2019 |
| CN | 109841749 A | 6/2019 |
| CN | 110993671 A | 4/2020 |
| CN | 111682052 A | 9/2020 |
| CN | 112366279 A | 2/2021 |

\* cited by examiner

DISPLAY PANEL, DISPLAY APPARATUS, AND MANUFACTURING METHOD FOR DISPLAY PANEL

CROSS REFERENCE TO RELATED APPLICATIONS

The present application is a national phase entry under 35 U.S.C. § 371 of International Application No. PCT/CN2021/115919, filed on Sep. 1, 2021, which claims priority to Chinese Patent Application No. 202011165747.4, filed with the China National Intellectual Property Administration on Oct. 27, 2020 and entitled "DISPLAY PANEL, DISPLAY APPARATUS, AND MANUFACTURING METHOD FOR DISPLAY PANEL", the entire contents of which are incorporated herein by reference.

FIELD

The present disclosure relates to the technical field of display, in particular to a display panel, a display apparatus and a manufacturing method for the display panel.

BACKGROUND

An organic light-emitting diode (OLED) is a display and lighting technology developed gradually in recent years, especially in the display industry, and is considered to have wide application prospects due to the advantages such as high response, high contrast and flexibility. Especially, top-emitting OLED devices become a main direction of research due to the advantages such as a higher aperture ratio and realizing optical extraction optimization by using a microcavity effect. Since a top-emitting structure is adopted, a top electrode serving as a light-emitting face of the OLED must have a good light transmittance.

SUMMARY

Embodiments of the present disclosure provide a display panel, including:
- a base substrate;
- a pixel defining layer including a plurality of opening regions and dams surrounding the opening regions;
- light-emitting portions in the opening regions;
- an electrode layer, located on one sides of the light-emitting portions facing away from the base substrate and including: first portions in the opening regions, second portions in a region where the dams are located, and third portions connecting the first portions and the second portions;
- a metal repelling portion, located on one side of the electrode layer facing away from the base substrate and located in the opening regions; and
- an auxiliary electrode layer located on one side of the pixel defining layer facing away from the base substrate and including auxiliary electrode portions located in a region where the dams are located.

The auxiliary electrode portions are in contact with the second portions of the electrode layer, and a material of the metal repelling portion and a material of the auxiliary electrode layer repel with each other, so that the auxiliary electrode layer forms a film in a region outside the region where the metal repelling portion is located.

In a possible implementation, a material of the metal repelling portion is 8-hydroxyquinolinolato-lithium.

In a possible implementation, a material of the auxiliary electrode layer is magnesium metal.

In a possible implementation, a height of the dams in a direction perpendicular to the base substrate is greater than a distance between a surface of the electrode layer facing away from the light-emitting portions and the base substrate.

In a possible implementation, the auxiliary electrode layer further includes extension portions extending from the auxiliary electrode portions and covering the third portions.

In a possible implementation, a thickness of the metal repelling portion in a direction perpendicular to the base substrate is 1 nm to 500 nm.

In a possible implementation, a thickness of the auxiliary electrode portions in the direction perpendicular to the base substrate is 1 nm to 500 nm.

In a possible implementation, a material of the electrode layer is magnesium silver, indium tin oxide, or zinc tin oxide.

Embodiments of the present disclosure further provide a display apparatus, including the display panel provided by the embodiments of the present disclosure.

Embodiments of the present disclosure further provide a manufacturing method for the display panel, including:
- providing a base substrate;
- forming a pixel defining layer on one side of the base substrate, wherein the pixel defining layer includes a plurality of opening regions and dams surrounding the opening regions;
- forming light-emitting portions in the opening regions of the pixel defining layer;
- forming an electrode layer on one sides of the light-emitting portions facing away from the base substrate;
- forming a metal repelling portion in the opening regions on one side of the electrode layer facing away from the light-emitting portions; and
- forming an auxiliary electrode layer on one side of the pixel defining layer facing away from the base substrate, so as to form auxiliary electrode portions in a region where the dams are located through repelling of a material of the metal repelling portion.

In a possible implementation, the forming the metal repelling portion in the opening regions on the side of the electrode layer facing away from the light-emitting portions including:
- forming the metal repelling portion in the opening regions on the side of the electrode layer facing away from the light-emitting portions through an ink-jet printing process.

In a possible implementation, the forming the auxiliary electrode layer on the side of the pixel defining layer facing away from the base substrate including:
- evaporating the auxiliary electrode layer on one side of the metal repelling portion facing away from the electrode layer by adopting a fully-open mask.

DETAILED DESCRIPTION OF THE EMBODIMENTS

In order to make objectives, technical solutions and advantages of the embodiments of the present disclosure clearer, the technical solutions of the embodiments of the present disclosure will be described clearly and completely with reference to accompanying drawings of the embodiments of the present disclosure. Obviously, the described embodiments are part of the embodiments of the present disclosure, but not all the embodiments. On the basis of the described embodiments of the present disclosure, all other embodiments obtained by those ordinarily skilled in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The words "first", "second" and the like used in the present disclosure do not indicate any order, quantity or importance, but are only used to distinguish different components. The word "comprise" or "include" or the like, means that an element or item preceding the word covers an element or item listed after the word and the equivalent thereof, without excluding other elements or items. The word "connection" or "coupling" or the like is not restricted to physical or mechanical connection, but may include electrical connection, whether direct or indirect. The words "upper", "lower", "left", "right" and the like are only used to indicate a relative position relationship, and after an absolute position of a described object is changed, the relative position relationship may be correspondingly changed.

In order to keep the following description of the embodiments of the present disclosure clear and concise, detailed description of known functions and known components are omitted in the present disclosure.

Figure 1:
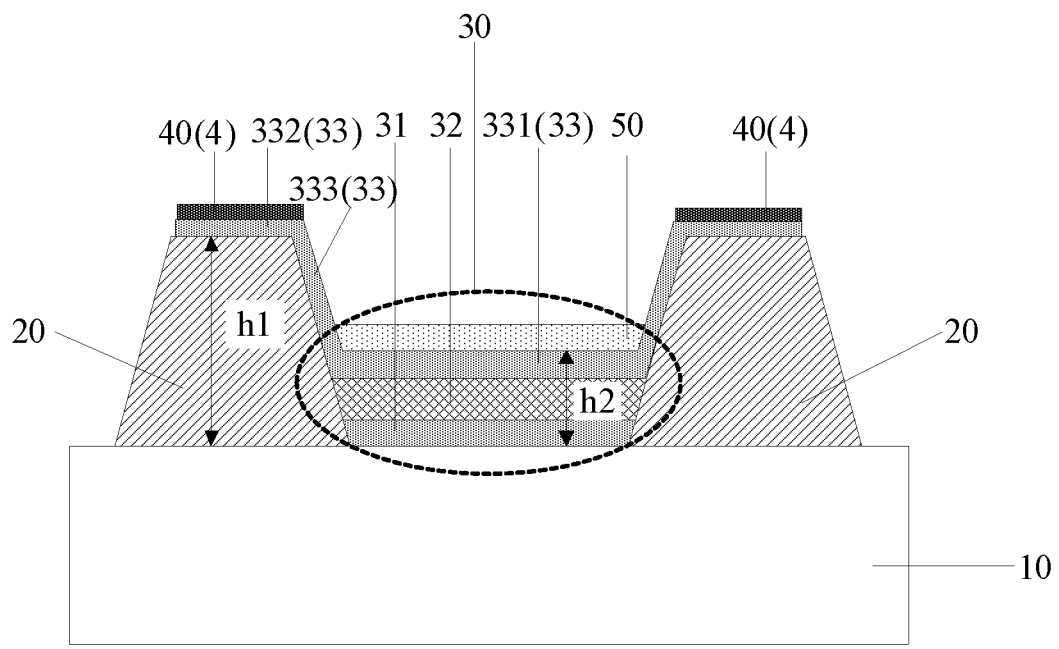
FIG. 1 is a schematic structural diagram of a display panel provided by an embodiment of the present disclosure.
Figure 2:
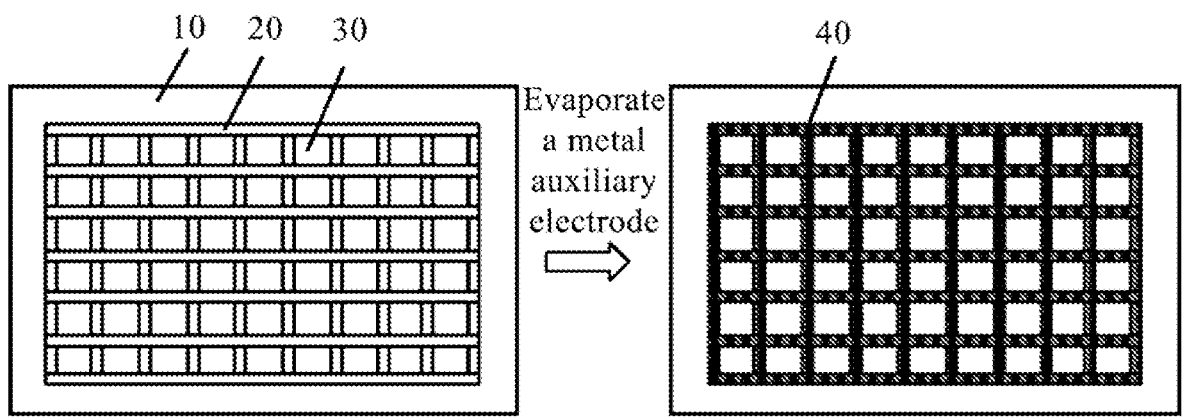
FIG. 2 is a schematic diagram of a display panel before and after an auxiliary electrode layer is manufactured provided by an embodiment of the present disclosure.

Referring to FIG. 1 and FIG. 2, embodiments of the present disclosure provides a display panel, including:
a base substrate 10;
a pixel defining layer, wherein the pixel defining layer includes a plurality of opening regions 30 and dams 20 surrounding the opening regions 30;
light-emitting portions 32, located in the opening regions 30;
an electrode layer 33, located on one sides of the light-emitting portions 32 facing away from the base substrate 10, wherein the electrode layer 33 includes first portions 331 located in the opening regions 30, second portions 332 located in a region where the dams 20 are located, and third portions 333 connecting the first portions 331 and the second portions 332; for example, the electrode layer 33 may be a cathode layer, and a material of the electrode layer 33 may be magnesium silver, indium tin oxide, or zinc tin oxide; an anode 31 may further be arranged between the light-emitting portions 32 and the base substrate 10;
a metal repelling portion 50, located on one side of the electrode layer 33 facing away from the base substrate 10, and located in the opening regions 30; for example, the metal repelling portion 50 may be only located in the opening regions 30; and
an auxiliary electrode layer 4, located on one side of the pixel defining layer facing away from the base substrate 10, and including auxiliary electrode portions 40 located in the region where the dams 20 are located, wherein the auxiliary electrode portions 40 are in contact with the second portions 332 of the electrode layer 33, a material of the metal repelling portion 50 and a material of the auxiliary electrode layer 4 repel with each other, so that the auxiliary electrode layer 4 forms a film outside a region where the metal repelling portion 50 is located. For example, an orthographic projection of the dams 20 on the base substrate 10 covers an orthographic projection of the auxiliary electrode portions 40 on the base substrate 10, and the orthographic projection of the auxiliary electrode portions 40 on the base substrate 10 may be a grid.

In some embodiments of the present disclosure, printing may be performed in the opening regions on one side of the electrode layer facing away from the base substrate through an ink-jet printing process to form the metal repelling portion. The auxiliary electrode layer may be formed by evaporation of the fully-open mask subsequently, since the material of the metal repelling portion and the material of the auxiliary electrode layer repel with each other, the auxiliary electrode layer cannot form a film in the region where the metal repelling portion is located, so that the auxiliary electrode portions are formed in the region where the dams are located. In prior art, when the auxiliary electrode portions are formed through a photolithography process, a plurality of masks and exposure processes are needed, in addition, technological characteristics such as high temperature and photoresist scouring are needed, damage to light-emitting layers of the OLED device needs to be avoided, and mass production is not suitable. The auxiliary electrode portions provided by the embodiments of the present disclosure do not need exquisite masks and exposure processes, and only need the fully-open mask for evaporation, thereby reducing the technology difficulty and manufacturing costs effectively.

It needs to be noted that FIG. 1 only takes one opening region 30 of the display panel as an example for illustration and description, and during implementations, the display panel may include a plurality of structures as shown in FIG. 1, the embodiments of the present disclosure are not limited to this.

During implementations, a material of the metal repelling portion 50 is 8-hydroxyquinolinolato-lithium. For example, a material of the auxiliary electrode layer 4 is magnesium metal. In the embodiments of the present disclosure, the material of the metal repelling portion is 8-hydroxyquinolinolato-lithium, the material of the auxiliary electrode layer 4 is magnesium metal, the two materials have a function of repelling with each other, which is beneficial to formation of patterned auxiliary electrode portions.

During implementations, a height h1 of the dams 20 in a direction perpendicular to the base substrate 10 is greater than a distance h2 between a surface of the electrode layer 33 facing away from the light-emitting portions 32 and the base substrate 10, so that the metal repelling portion 50 can be formed in the opening regions 30 through an ink-jet printing mode subsequently.

Figure 3:
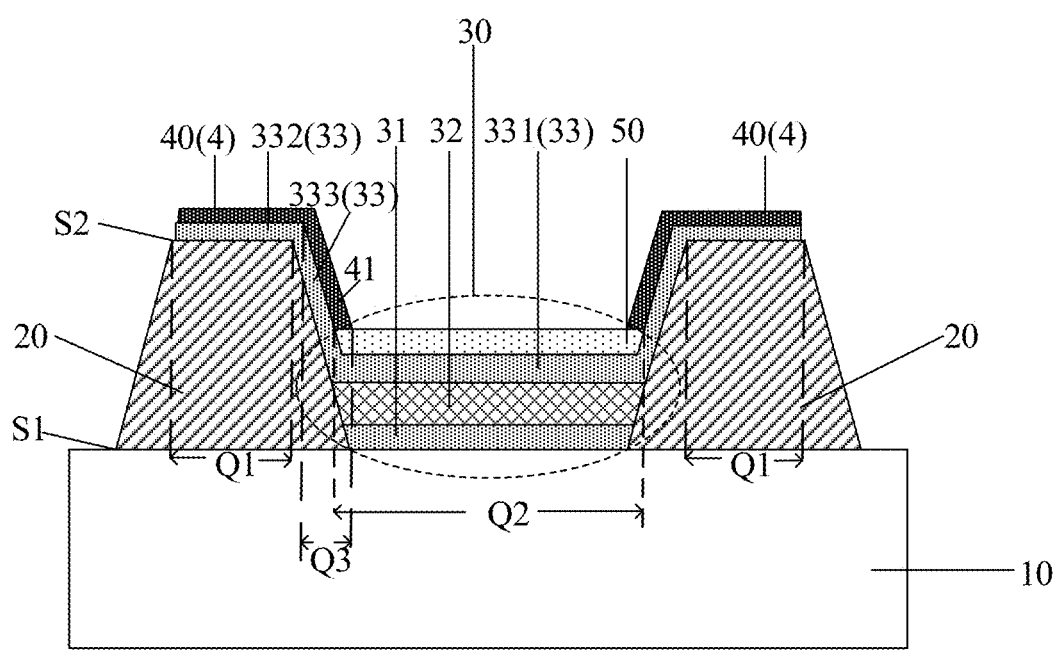
FIG. 3 is a schematic structural diagram of another display panel provided by an embodiment of the present disclosure.

During implementations, referring to FIG. 3, the auxiliary electrode layer 4 further includes extension portions 41 extending from the auxiliary electrode portions 40 and covering the third portions 333. An orthographic projection Q3 of the extension portions 41 on the base substrate 10 does not overlap with an orthographic projection (part of Q2 which does not overlap with Q3) of at least part of the first portions 331 on the base substrate 10. The dam 20 has a first surface S1 and a second surface S2 opposite to the first surface S1. The first surface S1 is substantially parallel to the second surface S2. The first surface S1 is closer to the base substrate 10 than the second surface S2. Orthographic projections Q1 of the second surfaces S2 of dams 20 on the base substrate 10 do not overlap with orthographic projections Q2 of the light-emitting portions 32 on the base substrate 10 and an orthographic projection Q2 of the metal repelling portion 50 on the base substrate 10. In the embodiments of the present disclosure, the auxiliary electrode layer 4 further includes the extension portions 41 extending from the auxiliary electrode portions 40 and covering the third portions 333, therefore the auxiliary electrode layer 4 and the electrode layer 33 may have more contact areas, so as to further reduce a resistance of the electrode layer 33. In addition, the extension portions 41 are formed on a side surface of the dams 20, so as to reflect light of the opening regions 30, and the light emitting quantity of the display panel is improved.

During implementations, a thickness of the metal repelling portion 50 in a direction perpendicular to the base substrate 10 is 1 nm to 500 nm. In the embodiments of the present disclosure, the thickness of the metal repelling portion 50 in the direction perpendicular to the base substrate 10 is 1 nm to 500 nm, so that the metal repelling portion 50 has a large light transmittance while repelling of the auxiliary electrode portions 40 is realized.

During implementations, a thickness of each of the auxiliary electrode portions 40 in the direction perpendicular to the base substrate 10 is 1 nm to 500 nm.

Based on the same inventive concept, embodiments of the present disclosure further provide a display apparatus, including the display panel provided by the embodiments of the present disclosure.

Figure 4:
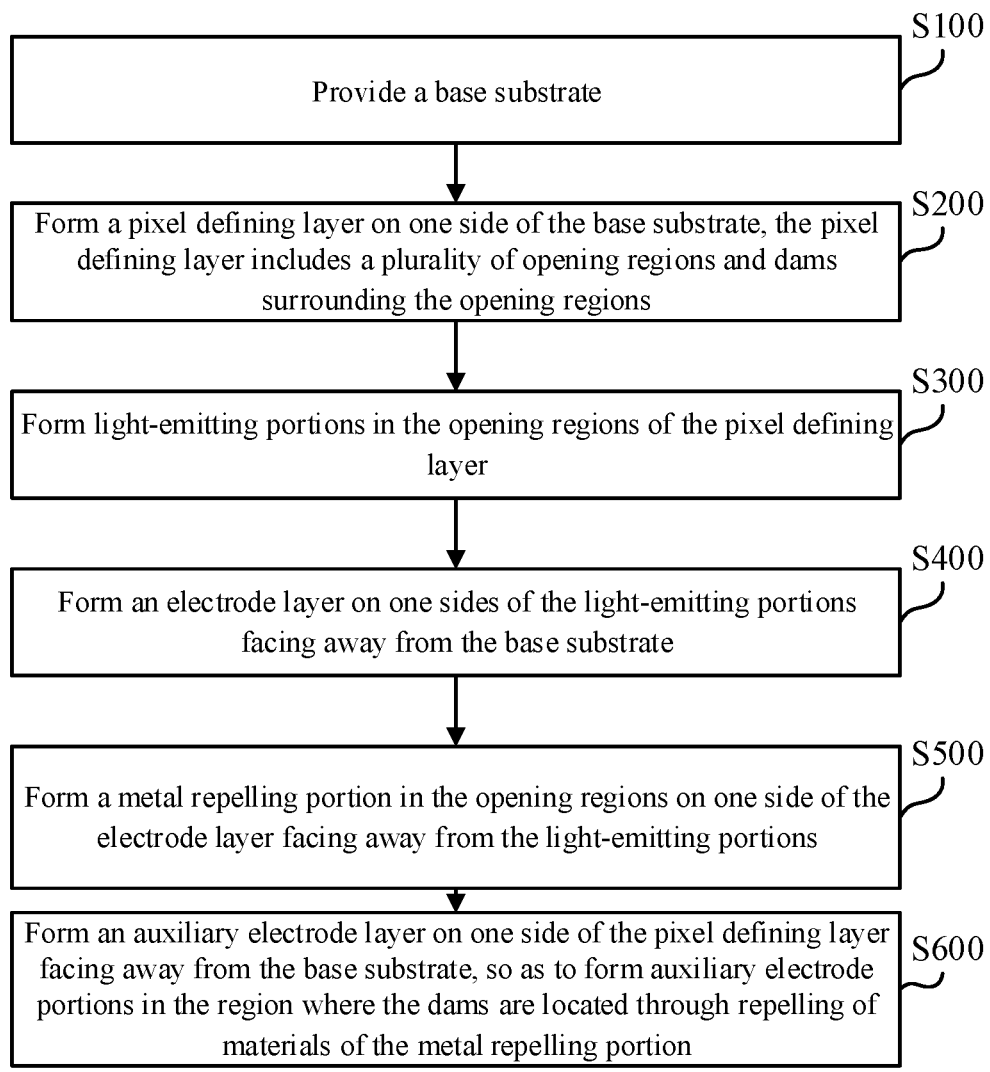
FIG. 4 is a schematic flow chart of manufacturing a display panel provided by an embodiment of the present disclosure.

Based on the same inventive concept, referring to FIG. 4, embodiments of the present disclosure further provide a manufacturing method for the display panel, including the following steps.

Step S100, a base substrate is provided.

Step S200, a pixel defining layer is formed on one side of the base substrate. The pixel defining layer includes a plurality of opening regions and dams surrounding the opening regions.

Step 300, light-emitting portions are formed in the opening regions of the pixel defining layer.

Step 400, an electrode layer is formed on one sides of the light-emitting portions facing away from the base substrate.

Step 500, a metal repelling portion is formed in the opening regions on one side of the electrode layer facing away from the light-emitting portions. For example, the metal repelling portion may be formed in the opening regions on the side of the electrode layer facing away from the light-emitting portions through an ink-jet printing process.

Step 600, an auxiliary electrode layer is formed on one side of the pixel defining layer facing away from the base substrate. The auxiliary electrode layer is formed in the region where the dams are located through repelling of a material of the metal repelling portion. For example, the auxiliary electrode layer may be evaporated on one side of the metal repelling portion facing away from the electrode layer by adopting a fully-open mask.

In order to understand the manufacturing method for the display panel provided by the embodiments of the present disclosure more clearly, the display panel shown in FIG. 1 is taken as an example for detailed description.

Step one, the pixel defining layer is formed on the base substrate 10. The pixel defining layer includes the opening regions 30 (namely pixel regions) and the dams 20 surrounding the opening regions 30. For example, the base substrate 10 may include a pixel circuit driving a pixel unit to emit light, and the pixel circuit may include a thin film transistor.

Step two, an anode 31, the light-emitting portions 32 (organic layers) and a transparent cathode (namely the electrode layer 33) are sequentially formed in the opening regions 30 from down to top. A manufacturing method for the anode 31 may include the steps of evaporation, magnetism sputtering or vapor deposition. A method for forming the light-emitting portions 32 may include an evaporation method and a printing method. The transparent cathode includes, but not limited to, a magnesium silver electrode, indium tin oxide (ITO) and zinc tin oxide (ZTO), and may be formed through an evaporation method or a magnetism sputtering method.

Step three, the metal repelling portion 50 is formed on the transparent cathode through an ink-jet printing method, and the metal repelling portion 50 may be 8-hydroxyquinolinolato-lithium.

Step four, magnesium metal is evaporated by using the fully-open mask to form the auxiliary electrode portions 40.

The embodiments of the present disclosure have the following beneficial effects: in the embodiments of the present disclosure, the metal repelling portion is formed by performing printing in the opening regions on one side of the electrode layer facing away from the base substrate through the ink-jet printing process, and the auxiliary electrode layer may be formed by evaporation of the fully-open mask subsequently. Since the material of the metal repelling portion and the material of the auxiliary electrode layer repel with each other, the auxiliary electrode layer cannot form a film in the region where the metal repelling portion is located, so that the auxiliary electrode layer is formed in the region where the dams are located. In the prior art, when the auxiliary electrode portions are formed through the photolithographic process, the multiple masks and exposure processes are needed, in addition, technological characteristics such as high temperature and photoresist scouring are needed, damage to light-emitting layers of the OLED device needs to be avoided, and mass production is not suitable. To the contrary, the auxiliary electrode portions provided by the embodiments of the present disclosure do not need the exquisite masks and exposure processes, and only need to use the fully-open mask for evaporation, thereby reducing the technology difficulty and manufacturing costs effectively.

Apparently, those skilled in the art can make various modifications and variations to the embodiments of the present disclosure without departing from the spirit and scope of the present disclosure. In this case, if these modifications and variations of the present disclosure fall within the scope of the claims and their equivalents, the present disclosure also intends to contain these modifications and variations.

What is claimed is:
1. A display panel, comprising:
a base substrate;
a pixel defining layer comprising:
    a plurality of opening regions; and
    dams surrounding the opening regions;

wherein the dams comprise:
  first surfaces, and
  second surfaces opposite to the first surfaces;
    wherein the first surfaces are parallel to the second surfaces and are closer to the base substrate than the second surfaces;
light-emitting portions in the opening regions;
an electrode layer, located on one sides of the light-emitting portions facing away from the base substrate and comprising:
  first portions in the opening regions;
  second portions in a region where the dams are located; and
  third portions connecting the first portions and the second portions;
a metal repelling portion, located on one side of the electrode layer facing away from the base substrate and located in the opening regions; and
an auxiliary electrode layer, located on one side of the pixel defining layer facing away from the base substrate and comprising:
  auxiliary electrode portions in the region where the dams are located; and
  extension portions extending from the auxiliary electrode portions and covering a part of the third portions;
  wherein the auxiliary electrode portions are in contact with the second portions of the electrode layer; an orthographic projection of the extension portions on the base substrate does not overlap with an orthographic projection of at least part of the first portions on the base substrate;
wherein a material of the metal repelling portion and a material of the auxiliary electrode layer repel with each other, so that the auxiliary electrode layer forms a film in a region outside a region where the metal repelling portion is located;
orthographic projections of the second surfaces of dams on the base substrate does not overlap with orthographic projections of the light-emitting portions on the base substrate and an orthographic projection of the metal repelling portion on the base substrate.

2. The display panel according to claim 1, wherein the material of the metal repelling portion is 8-hydroxyquinolinato-lithium.

3. The display panel according to claim 2, wherein the material of the auxiliary electrode layer is magnesium metal.

4. The display panel according to claim 1, wherein a height of the dams in a direction perpendicular to the base substrate is greater than a distance between a surface of the electrode layer facing away from the light-emitting portions and the base substrate.

5. The display panel according to claim 1, wherein a thickness of the metal repelling portion in a direction perpendicular to the base substrate is 1 nm to 500 nm.

6. The display panel according to claim 5, wherein a thickness of the auxiliary electrode portions in the direction perpendicular to the base substrate is 1 nm to 500 nm.

7. The display panel according to claim 1, wherein a material of the electrode layer is:
  magnesium silver, or
  indium tin oxide, or
  zinc tin oxide.

8. A display apparatus, comprising the display panel according to claim 1.

9. A manufacturing method for the display panel according to claim 1, comprising:
  providing the base substrate;
  forming the pixel defining layer on one side of the base substrate;
  forming the light-emitting portions in the opening regions of the pixel defining layer;
  forming the electrode layer on one sides of the light-emitting portions facing away from the base substrate;
  forming the metal repelling portion in the opening regions on one side of the electrode layer facing away from the light-emitting portions; and
  forming the auxiliary electrode layer on one side of the pixel defining layer facing away from the base substrate, so as to form the auxiliary electrode portions in the region where the dams are located and the extension portions extending from the auxiliary electrode portions and covering the third portions through repelling of a material of the metal repelling portion.

10. The manufacturing method according to claim 9, wherein said forming the metal repelling portion in the opening regions on the side of the electrode layer facing away from the light-emitting portions comprises:
  forming the metal repelling portion in the opening regions on the side of the electrode layer facing away from the light-emitting portions through an ink-jet printing process.

11. The manufacturing method according to claim 10, wherein said forming the auxiliary electrode layer on the side of the pixel defining layer facing away from the base substrate comprises:
  evaporating the auxiliary electrode layer on one side of the metal repelling portion facing away from the electrode layer by adopting a fully-open mask.

12. The display panel according to claim 1, wherein the light-emitting portions and the metal repelling portion are completely in the opening regions.

13. The display panel according to claim 1, wherein a height of the dams in a direction perpendicular to the base substrate is greater than a maximum distance between a surface of the first portions facing away from the light-emitting portions and the base substrate.

14. The display panel according to claim 1, wherein an edge of the extension portion close to a center of the opening region is in contact with an edge of the metal repelling portion away from the center of the opening region.

* * * * *